(12) United States Patent
Choi et al.

(10) Patent No.: US 11,096,279 B2
(45) Date of Patent: Aug. 17, 2021

(54) DISPLAY APPARATUS

(71) Applicant: LG Display Co., Ltd., Seoul (KR)

(72) Inventors: YoungJin Choi, Paju-si (KR); SeungJoon Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/714,427

(22) Filed: Dec. 13, 2019

(65) Prior Publication Data

US 2020/0214127 A1 Jul. 2, 2020

(30) Foreign Application Priority Data

Dec. 28, 2018 (KR) .......................... 10-2018-0172812

(51) Int. Cl.
| | |
|---|---|
| *H05K 1/11* | (2006.01) |
| *H05K 3/36* | (2006.01) |
| *H05K 1/18* | (2006.01) |
| *G09G 3/20* | (2006.01) |

(52) U.S. Cl.
CPC ............. *H05K 1/111* (2013.01); *G09G 3/20* (2013.01); *H05K 1/189* (2013.01); *H05K 3/361* (2013.01); *H05K 2201/10128* (2013.01)

(58) Field of Classification Search
None
See application file for complete search history.

(56) References Cited

U.S. PATENT DOCUMENTS

2015/0189768 A1* 7/2015 Kishida ............. H05K 1/147
361/749
2016/0196795 A1* 7/2016 Kim ................. G09G 3/3648
345/211

FOREIGN PATENT DOCUMENTS

| KR | 10-2004-0055341 A | 6/2004 |
|---|---|---|
| KR | 10-2018-0029157 A | 3/2018 |

* cited by examiner

*Primary Examiner* — Stephen T. Reed
(74) *Attorney, Agent, or Firm* — Fenwick & West LLP

(57) ABSTRACT

A display apparatus includes a display panel, a plurality of flexible circuit films, and a printed circuit board. The flexible circuit films are attached to a first side of the display panel. The printed circuit board is attached onto each of the flexible circuit films. The flexible circuit film includes an input pad portion, an output pad portion, a first driving integrated circuit, a second driving integrated circuit, and a slit. The input pad portion has a first width, and is attached to the printed circuit board. The output pad portion has the same width as the first width, and is attached to the display panel. The slit is arranged between the first driving integrated circuit and the second driving integrated circuit, and passes through the flexible circuit film.

15 Claims, 5 Drawing Sheets

DISPLAY APPARATUS

CROSS-REFERENCE TO RELATED APPLICATIONS

This application claims the benefit of Republic of Korea Patent Application No. 10-2018-0172812 filed on Dec. 28, 2018, which is hereby incorporated by reference as if fully set forth herein.

BACKGROUND

Field

The present disclosure relates to a display apparatus.

Discussion of the Related Art

Recently, a display apparatus has become more important with the development of multimedia. In this respect, a flat panel display apparatus such as a liquid crystal display apparatus, an organic light emitting display apparatus, and a light emitting diode display apparatus has been commercially used.

Each of the liquid crystal display apparatus and the organic light emitting display apparatus includes a display panel having a plurality of pixels having thin film transistors connected to data lines and gate lines, a data driving circuit for supplying a data voltage to the data lines, and a gate driving embedded circuit for supplying a gate signal to the gate lines.

Generally, the data driving circuit and the gate driving embedded circuit are embodied as integrated circuits, and each of the data driving integrated circuit and the gate driving integrated circuit is packaged in a data flexible circuit film such as a Chip-On-Film and then attached to a display panel.

Recently, a Gate-In-Panel (GIP)-type display apparatus having a gate driving embedded circuit in a non-display area of a display panel has been used simultaneously with a manufacturing process of a thin film transistor of each pixel to simplify a structure of circuit components, reduce the manufacturing cost and reduce a bezel width. Such a gate driving embedded circuit of a GIP structure operates by a plurality of gate control signals supplied through a first data flexible circuit film, in which a data driving integrated circuit is packaged, and a display panel.

However, in the conventional display apparatus, as the number of the gate control signals for driving the gate driving embedded circuit is increased, the size of the data flexible circuit film is increased. This may cause a bonding space between the data flexible circuit film and the display panel to be deficient, or may cause adjacent data flexible circuit films to be overlapped with each other. To solve such problems, a separate gate control signal transmission film may be used. However, in this case, a problem occurs in that additional components are required.

SUMMARY

An object of the present disclosure is to provide a display apparatus capable of transmitting gate control signals to a display panel through data flexible circuit films.

The display apparatus according to the present disclosure includes a display panel, a plurality of flexible circuit films, and a printed circuit board. The display panel includes a plurality of gate lines and a plurality of data lines. The flexible circuit films are attached to a first side of the display panel. The printed circuit board is attached to each of the flexible circuit films. The flexible circuit film includes an input pad portion, an output pad portion, a first driving integrated circuit, a second driving integrated circuit, and a slit. The input pad portion has a first width, and is attached to the printed circuit board. The output pad portion has the same width as the first width, and is attached to the display panel. The first driving integrated circuit and the second driving integrated circuit are arranged between the input pad portion and the output pad portion and spaced apart from each other with a predetermined interval. The slit is arranged between the first driving integrated circuit and the second driving integrated circuit, and passes through the flexible circuit film.

In one embodiment, the display apparatus further includes a driving power pad arranged near the slit and extended from the input pad portion to the output pad portion to supply a driving power.

In one embodiment, the driving power pad includes a first driving power pad and a second driving power pad. The first driving power pad is extended from the input pad portion to the first driving integrated circuit to supply the driving power. The second driving power pad is extended from the input pad portion to the second driving integrated circuit to supply the driving power.

In one embodiment, the driving power pad is arranged on both of a left side and a right side of the slit.

In one embodiment, the input pad portion includes a plurality of data input pads corresponding to the data lines, and a driving power input pad supplied with a driving power. The plurality of data input pads are spaced apart from each other with a first interval. The driving power input pad is spaced apart from its adjacent data input pad with a second interval greater than the first interval.

In one embodiment, the output pad portion includes a plurality of data output pads corresponding to the data lines, and a driving power output pad for outputting a driving power. The plurality of data output pads are spaced apart from each other with a first interval. The driving power output pad is spaced apart from its adjacent data output pad with a second interval greater than the first interval.

In one embodiment, the display apparatus further includes a gate driving unit arranged at one of a second side and a third side perpendicular to the first side of the display panel and connected to the plurality of gate lines. An outermost flexible circuit film adjacent to the gate driving unit among the plurality of flexible circuit films further includes a gate driving pad for supplying gate driving signals to the gate driving unit.

In one embodiment, the outermost flexible circuit film includes first data pads and first pads. The other flexible circuit films include second data pads and second pads. The number of the first data pads is the same as the number of the second data pads. The number of the first pads is the same as the number of the second pads. The first pads transfer the gate driving signal, and the second pads supply a driving power to the display panel.

In one embodiment, the output pad portion includes a first output pad portion corresponding to the first driving integrated circuit, and a second output pad portion corresponding to the second driving integrated circuit. The slit is provided between the first output pad portion and the second output pad portion, and has with a width greater than ½ of the first width. A bonding means is further provided in the slit.

In one embodiment, the first output pad portion and the second output pad portion are spaced apart from each other by the slit, and each of them has a second width smaller than ½ of the first width. The bonding means is arranged between the first output pad portion and the second output pad portion.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION OF THE DISCLOSURE

Figure 1:
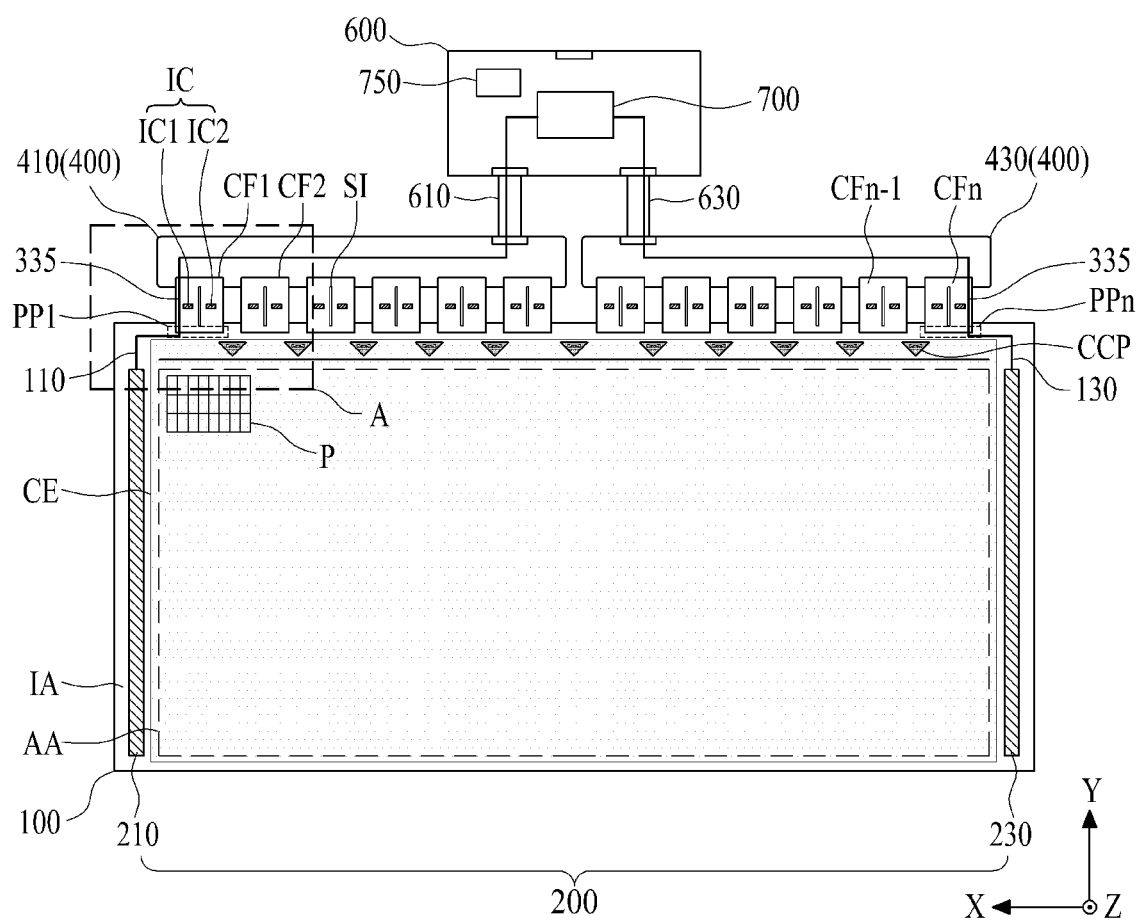
FIG. 1 is a plane view illustrating a display apparatus according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a position relationship, for example, when the position relationship between two portions is described as 'upon~', 'above~', 'below~' and 'next to~', one or more other portions may be arranged between the two portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Hereinafter, an electroluminescence display apparatus according to the present disclosure will be described in detail with reference to the accompanying drawings. In the drawings, the same or similar elements are denoted by the same reference numerals even though they are depicted in different drawings. Also, in the following description of the present disclosure, if detailed description of elements or functions known in respect of the present disclosure is determined to make the subject matter of the present disclosure unnecessarily obscure, the detailed description will be omitted.

Figure 2:
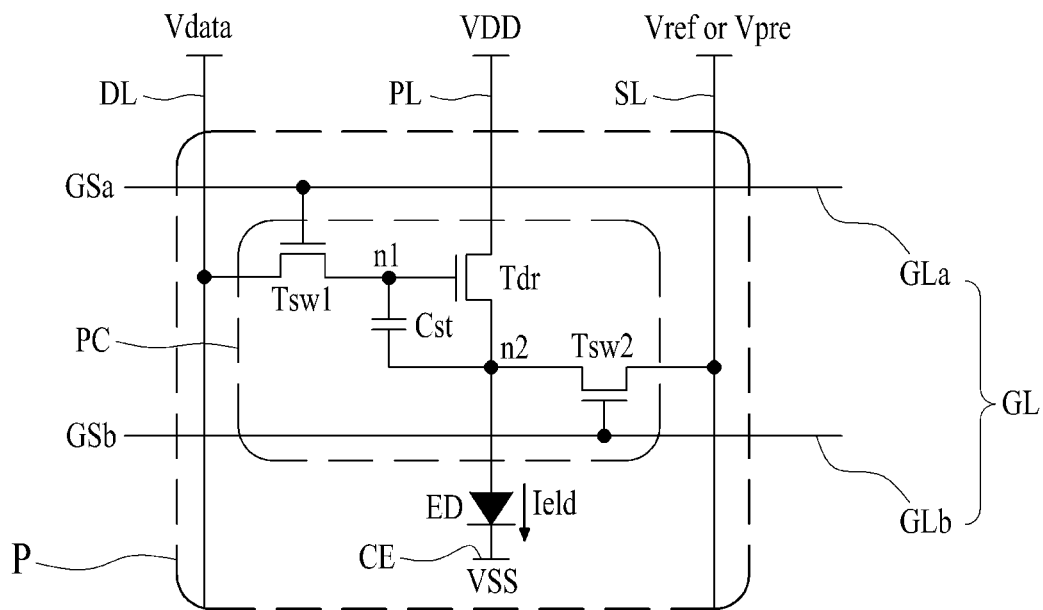
FIG. 2 is a view illustrating a single pixel shown in FIG. 1 according to one embodiment of the present disclosure.
Figure 3:
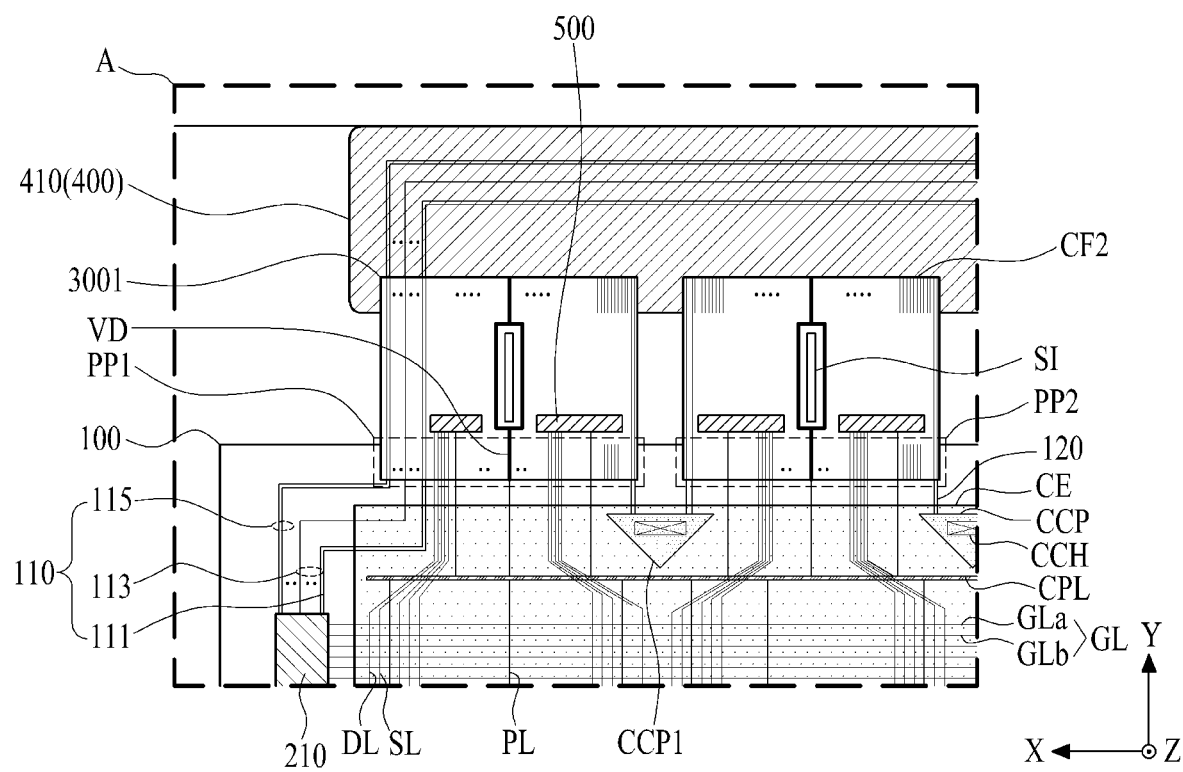
FIG. 3 is an enlarged view of a portion 'A' shown in FIG. 1 according to one embodiment of the present disclosure.

FIG. 1 is a plane view illustrating a display apparatus according to one embodiment of the present disclosure. FIG. 2 is a view illustrating a single pixel shown in FIG. 1 according to one embodiment of the present disclosure. FIG. 3 is an enlarged view of a portion 'A' shown in FIG. 1 according to one embodiment of the present disclosure.

Referring to FIGS. 1 to 3, the display apparatus according to one embodiment of the present disclosure may include a display panel 100, a gate driving unit 200, first to nth data flexible circuit films CF1 to CFn, a printed circuit board 400, and a plurality of driving circuits IC.

The display panel 100 may be divided into a display portion AA having a plurality of pixels P arranged on a substrate, and a non-display portion IA surrounding the display portion AA.

The plurality of pixels P are formed on a pixel area defined by a plurality of gate lines GL and a plurality of data lines DL, which cross each other, and by a plurality of sensing lines SL parallel with the plurality of data lines DL.

The plurality of gate lines GL are respectively formed in parallel along a first direction of the display panel 100, for example, a horizontal direction. Each of the plurality of gate lines GLi may include first and second sub gate lines GLa and GLb adjacent to each other. The first and second sub gate lines GLa and GLb are separately supplied with first and second gate signals GSa and GSb from the gate driving unit 200.

The plurality of data lines DL are respectively formed in parallel along a second direction of the display panel 100, for example, a vertical direction, so as to respectively cross the plurality of gate lines GL. The plurality of data lines DL are separately supplied with a data voltage Vdata from a data driving integrated circuit IC. In this case, the data voltage Vdata supplied to each of the plurality of data lines DL includes a threshold voltage of a driving transistor included in a corresponding pixel P, and a compensation voltage to compensate for a characteristic change value such as mobility.

Each of the plurality of sensing lines SL is formed in parallel with each of the plurality of data lines DL. Each of the plurality of sensing lines SL is selectively supplied with a reference voltage Vref and a precharging voltage Vpre from the data driving integrated circuit IC. For example, the reference voltage Vref is selectively supplied to each of the sensing lines SL in a display mode, and the precharging voltage Vpre is selectively supplied to each of the sensing lines SL in a sensing mode. In this case, each of the plurality of sensing lines SL may be formed for each pixel P, or may be formed for a single unit pixel having a plurality of pixels P.

The display panel 100 according to one embodiment of the present disclosure further includes a plurality of pixel driving voltage lines PL formed in parallel to a plurality of data lines DLi. Each of the plurality of pixel driving voltage lines PL is supplied with a pixel driving voltage VDD from the data driving integrated circuit IC, or is supplied with the pixel driving voltage VDD from a power supplying unit through the data driving integrated circuit IC. Herein, each of the plurality of pixel driving voltage lines PL may be formed for each pixel P, or may be formed for a single unit pixel having a plurality of pixels P.

Each of the plurality of pixels P includes a light emitting diode ED and a pixel circuit PC.

The light emitting diode ED emits light in proportion to a data current Ield which flows from a pixel driving voltage line PL to a cathode voltage VSS line in accordance with a driving of the pixel circuit PC. The light emitting diode ED is interposed between a first electrode (or an anode electrode) and a second electrode (or a cathode electrode) connected to the pixel circuit PC, and may include at least one of an organic light emitting portion, a quantum dot light emitting portion, and an inorganic light emitting portion. Alternatively, the light emitting diode ED may include a micro light emitting diode.

The light emitting diode ED according to one embodiment includes two or more light emitting portions for emitting white light. For example, the light emitting diode ED may include a first light emitting portion and a second light emitting portion for emitting white light by mixture of first light and second light. The first light emitting portion for emitting first light may include one of a blue light emitting portion, a green light emitting portion, a red light emitting portion, a yellow light emitting portion, and a yellow-green light emitting portion. The second light emitting portion may include one of a blue light emitting portion, a green light emitting portion, a red light emitting portion, a yellow light emitting portion, and a yellow-green light emitting portion, which has a complementary color with the first light.

The light emitting diode ED according to another embodiment may include a blue light emitting portion, a green light emitting portion, or a red light emitting portion.

A cathode electrode CE may be formed to be commonly connected to the light emitting diodes ED provided in each of the plurality of pixels P. For example, the cathode electrode CE may be formed on a substrate to cover the display portion AA, and its edge portion is overlapped with the non-display portion IA.

The pixel circuit PC may include a first switching transistor Tsw1, a second switching transistor Tsw2, a driving transistor Tdr, and a capacitor Cst. Herein, the transistors Tsw1, Tsw2, and Tdr are N-type thin film transistors TFT, each of which may be an a-Si thin film transistor, a poly-Si thin film transistor, an oxide thin film transistor, an organic thin film transistor, etc.

The first switching transistor Tsw1 includes a gate electrode connected to a first sub gate line GLa of a gate line GL, a first electrode connected to a data line DL adjacent thereto, and a second electrode connected to a first node n1 which is a gate electrode of the driving transistor Tdr. The first switching transistor Tsw1 supplies a data voltage Vdata, which is supplied from the data line DL, to the first node n1, i.e., the gate electrode of the driving transistor Tdr, in accordance with a first gate signal GSa of a gate on voltage level supplied to the first sub gate line GLa.

The second switching transistor Tsw2 includes a gate electrode connected to a second sub gate line GLb of the gate line GL, a first electrode connected to a sensing line SL adjacent thereto, and a second electrode connected to a second node n2 which is a source electrode of the driving transistor Tdr. The second switching transistor Tsw2 supplies a reference voltage Vref or a precharging voltage Vpre, which is suppled from the sensing line SL, to the second node n2, i.e., the source electrode of the driving transistor Tdr in accordance with a second gate signal GSb of a gate on voltage level supplied to the second sub gate line GLb.

The capacitor Cst is connected between the gate electrode and the source electrode of the driving transistor Tdr, i.e., between the first and second nodes n1 and n2. The capacitor Cst charges a differential voltage between voltages supplied to the first and second nodes n1 and n2, and then switches the driving transistor Tdr in accordance with the charged voltage.

The driving transistor Tdr includes a gate electrode commonly connected to the second electrode of the first switching transistor Tsw1 and a first electrode of the capacitor Cst, a source electrode commonly connected to the first electrode of the second switching transistor Tsw2, a second electrode of the capacitor Cst, and the light emitting diode ED, and a drain electrode connected to the pixel driving voltage line PL. The driving transistor Tdr is turned on by a voltage of the capacitor Cst, thereby controlling the amount of a current flowing from the pixel driving voltage line PL to the light emitting diode ED.

The pixel circuit PC operates at a data charging period and a light emitting period, according to the gate signal supplied from the gate driving unit 200. That is, the pixel circuit PC charges a differential voltage Vdata-Vref between a data voltage Vdata and a reference voltage Vref in the capacitor Cst for the data charging period. Then, the pixel circuit PC turns on the driving transistor Tdr for the light emitting period in accordance with the voltage stored in the capacitor Cst, thereby emitting the light emitting diode ED by the data current Iled determined by the differential voltage Vdata-Vref between the data voltage Vdata and the reference voltage Vref. Also, the pixel circuit PC operates at an initialization period, a data charging period and a sensing period, according to the gate signal supplied from the gate driving unit 200 for the sensing period. That is, the pixel circuit PC charges a differential voltage between a sensing data voltage and a precharging voltage Vpre in the capacitor for the initialization period. Then, the pixel circuit PC floats the sensing lines SL for the data charging period, thereby charging a voltage corresponding to a current flowing to the driving transistor Tdr turned on by the sensing data voltage, in the sensing lines SL which are in a floating state. Then, for the sensing period, the pixel circuit PC outputs the voltage charged in the sensing lines SL as a sensing voltage.

In one embodiment, the description has been described based on that the pixel circuit PC includes three transistors and one capacitor. However, various modifications may be made in the number of the transistors and the capacitors, which constitute the pixel circuit PC.

The display panel 100 according to one embodiment further includes first to nth pad portions PP1 to PPn, a first gate control signal line portion 110, and a second gate control signal line portion 130.

Each of the first to nth pad portions PP1 to PPn is provided on an upper non-display portion of the non-display portion IA, which is adjacent to one ends of a plurality of data lines, and is electrically connected to the one ends of the plurality of data lines. For example, under the assumption that the number of the data lines is 'm', each of the first to nth pad portions PP1 to PPn may be connected to 'i' data lines ('i'=m/n) one to one, wherein each of m, n, and i is a natural number.

Each of the first to nth pad portions PP1 to PPn according to one embodiment may include 'i' data pads connected to one ends of a plurality of data lines, respectively. Additionally, each of the first to nth pad portions PP1 to PPn according to one embodiment may include T pixel driving voltage pads Cy is a natural number equal to or smaller than 'i') for supplying the pixel driving voltage VDD to each of the plurality of pixel driving voltage lines PL provided on the display panel 100, T sensing line pads for selectively supplying the reference voltage Vref and the precharging voltage Vpre to T sensing lines SL, and at least one cathode voltage pad for supplying a cathode voltage VSS to the cathode electrode CE. Each of the first pad portion PP1 and the nth pad portion PPn among the first to nth pad portions PP1 to PPn according to one embodiment further includes a plurality of gate pads and a plurality of dummy pads.

The first gate control signal line portion 110 is provided at one edge portion of the substrate 100 adjacent to the first pad portion PP1, and is connected to the plurality of gate pads provided at the first pad portion PP1 to thus be connected to the gate driving unit 200. The first gate control signal line portion 110 according to one embodiment may include an odd-numbered gate start signal line 111, an odd-numbered clock line portion 113, and a gate power line portion 115. Herein, the odd-numbered clock line portion 113 may include a plurality of odd-numbered gate shift clock lines, a plurality of odd-numbered carry clock lines, and a plurality of odd-numbered reset clock lines. The gate power line portion 115 may include at least one high potential driving voltage line and at least one low potential driving voltage line. The lines in the first gate control signal line portion 110 may be connected to the plurality of gate pads provided at the first pad portion PP1 one to one.

The second gate control signal line portion 130 is provided at another edge portion of the substrate 100 adjacent to the nth pad portion PPn, and is connected to the plurality of gate pads provided at the second pad portion PP2 to thus be connected to the gate driving unit 200. The second gate control signal line portion 130 according to one embodiment may include an even-numbered gate start signal line, an even-numbered clock line portion, and a gate power line portion. Herein, the even-numbered clock line portion may include a plurality of even-numbered gate shift clock lines, a plurality of even-numbered carry clock lines, and a plurality of even-numbered reset clock lines. The gate power line portion 115 may include at least one high potential driving voltage line and at least one low potential driving voltage line. The lines in the second gate control signal line portion 130 may be connected to the plurality of gate pads provided at the second pad portion PP2 one to one.

The display panel 100 according to one embodiment further includes a plurality of cathode contact portions CCP, and a plurality of cathode power supply lines 120.

The plurality of cathode contact portions CCP may be provided among the first to nth pad portions PP1 to PPn overlapped with the cathode electrode CE. Each of the plurality of cathode contact portions CCP is electrically connected to an edge portion of the cathode electrode CE through a cathode contact hole CCH.

Each of the cathode power supply lines 120 connects at least one cathode voltage pad provided at each of the first to nth pad portions PP1 to PPn, to a plurality of corresponding cathode contact portions CCP. For example, some of the cathode power supply lines 120 connected to a first cathode contact portion CCP1 provided between the first pad portion PP1 and the second pad portion PP2 may be connected to at least one cathode voltage pads provided at the first pad portion PP1, and the others of the cathode power supply lines 120 connected to the first cathode contact portion CCP1 may be connected to at least one cathode voltage pads provided at the second pad portion PP2. That is, each of the cathode contact portions CCP may be connected to the cathode voltage pad(s) provided at each of two adjacent pad portions, through the plurality of cathode power supply lines 120.

The display panel 100 according to one embodiment may further include a driving voltage common line CPL commonly connected to the plurality of pixel driving voltage lines PL.

The driving voltage common line CPL may be provided between an upper non-display portion of the non-display portion IA, which is adjacent to one ends of the plurality of data lines, and the display portion AA. The driving voltage common line CPL is connected to T pixel driving voltage pads VD provided at each of the first to nth pad portions PP1 to PPn, and is commonly connected to one ends of the plurality of pixel driving voltage lines PL. The driving voltage common line CPL serves to uniformly supply the pixel driving voltage VDD, which is supplied through the T pixel driving voltage pads VD, to each of the plurality of pixel driving voltage lines PL. In a case that the display apparatus according to one embodiment includes the driving voltage common line CPL, the number of pixel driving voltage pads VD provided at each of the first to nth pad portions PP1 to PPn may be reduced. In this case, in the present disclosure, as the number of the pixel driving voltage pads VD is reduced, a width of a data flexible circuit film may be reduced.

The gate driving unit 200 is formed on the non-display portion IA provided at one side and/or both sides of the display panel 100, and is connected to the gate lines GL. The gate driving unit 200 may be directly formed on the substrate of the display panel 100 together with the process of forming a thin film transistor of each pixel P, thereby being connected to one side or both sides of each of the gate lines GL.

The gate driving unit 200 generates first and second gate signals GSa and GSb of a gate on voltage level per one horizontal period, under the control of a timing controller 700, thereby sequentially supplying them to the gate lines GL. Each of the first and second gate signals GSa and GSb has a gate on voltage level for a data charging period of each pixel P, and has a gate off voltage level for a light emitting period of each pixel P. Further, the gate driving unit 200 generates first and second gate signals GSa and GSb and supplies them to corresponding gate lines GL under the control of the timing controller 700 for a sensing period set to some horizontal periods of one frame, wherein the first and second gate signals are intended to drive each pixel P of selected horizontal lines at an initialization period, a voltage charging period, and a voltage sensing period. At this time, the first gate signal GSa has a gate on voltage level only for the initialization period and the voltage charging period, and the second gate signal GSb has a gate on voltage level only for the initialization period and the sensing period.

The gate driving unit 200 according to one embodiment may be formed in the non-display portion IA at one side of the substrate, and may operate in accordance with a single feeding method to supply a gate signal to each of the plurality of gate lines GL. Gate driving units 200 according to another embodiment may be formed in the non-display portion IA on the right and left sides of the substrate, and may operate in accordance with a double feeding method to supply a gate signal to each of the plurality of gate lines GL. As another example, the gate driving units 200 may be formed in the non-display portion IA on the right and left sides of the substrate, and may operate in accordance with an interlacing method of the double feeding method to supply a gate signal to each of the plurality of gate lines GL. Hereinafter, it is assumed that the gate driving unit 200 operates in accordance with an interlacing method of a double feeding method.

The gate driving unit 200 according to one embodiment may include a first gate driving embedded circuit 210, and a second gate driving embedded circuit 230.

The first gate driving embedded circuit 210 is provided at the non-display portion IA (left non-display portion) on one side of the substrate, and is electrically connected to one end of each odd-numbered gate line among the plurality of gate lines GL. The first gate driving embedded circuit 210 generates first and second gate signals GSa and GSb in response to a plurality of first gate control signals input through the first gate control signal line portion 110 of the display panel 100, thereby supplying the first and second gate signals to a corresponding odd-numbered gate line GL.

The second gate driving embedded circuit 230 is provided at the non-display portion IA (right non-display portion) on another side of the substrate, and is electrically connected to the other end of each even-numbered gate line among the plurality of gate lines GL. The second gate driving embedded circuit 230 generates first and second gate signals GSa and GSb in response to a plurality of second gate control signals input through the second gate control signal line portion 130 of the display panel 100, thereby supplying the first and second gate signals GSa and GSb to a corresponding even-numbered gate line GL.

Each of first to nth data flexible circuit films CF1 to CFn is attached to the display panel 100. Each of the first to nth data flexible circuit film CF1 to CFn may be formed as a Tape Carrier Package (TCP) or a Chip On Flexible Board (or Chip On Film). Each of the first to nth data flexible circuit films CF1 to CFn is attached to the first to nth pad portions PP1 to PPn of the display panel 100 one to one by a film attachment process using an anisotropic conductive film. Herein, a Tape Automated Bonding (TAB) process may be used as the film attachment process.

The first to nth data flexible circuit films CF1 to CFn according to one embodiment are the same as one another in size and shape. For example, the first to nth data flexible circuit films CF1 to CFn may have a shape of a square or a rectangle. Alternatively, the first to nth data flexible circuit films CF1 to CFn may have the same length (side on the Y-axis) and the same width (side on the X-axis).

The printed circuit board 400 may commonly be attached to the first to nth data flexible circuit films CF1 to CFn by a film attachment process using an anisotropic conductive film. The printed circuit board 400 transmits an externally input signal to the first to nth data flexible circuit films CF1 to CFn.

The printed circuit board 400 according to one embodiment may include a first printed circuit board 410 commonly attached to first to (n/2)th data flexible circuit films CF1 to CFn/2 among the first to nth data flexible circuit films CF1 to CFn, and a second printed circuit board 430 commonly attached to (n/2+1)th to nth data flexible circuit films CFn/2+1 to CFn among the first to nth data flexible circuit films CF1 to CFn. However, the present disclosure is not limited to this.

Each of a plurality of data driving integrated circuits IC includes a first driving integrated circuit IC1 and a second driving integrated circuit IC2 as a set. Each set of the plurality of data driving integrated circuits IC is packaged in the first to nth data flexible circuit films CF1 to CFn one to one. That is, one first driving integrated circuit IC1 and one second driving integrated circuit IC2 are arranged in one of the first to nth data flexible circuit films CF1 to CFn. Each set of the plurality of data driving integrated circuits IC is connected to 'i' data lines, 'j' pixel driving power lines and 'j' sensing lines through corresponding data flexible circuit films CF1 to CFn and corresponding data pad portions PP1 to PPn.

Each of the plurality of data driving integrated circuits IC according to one embodiment supplies a data voltage Vdata and a reference voltage Vref to each pixel P, senses a threshold voltage and a mobility characteristic change of the driving transistor Tdr of each pixel P, and outputs the sensing value of the driving transistor Tdr to the outside. To this end, each of the plurality of data driving integrated circuits IC according to one embodiment may include a data driving unit and a sensing unit.

The data driving unit converts digital data per pixel into an analog type data signal by using digital data per pixel, a data control signal and a plurality of reference gamma voltages, which are input through the printed circuit board 400 and a corresponding data flexible circuit film, per one horizontal period, and supplies the converted data signal to 'i' corresponding data lines DL through corresponding data flexible circuit films CF1 to CFn and corresponding data pad portions PP1 to PPn. The data driving unit also converts sensing digital data supplied from the outside into a sensing data voltage for a sensing period, thereby supplying the sensing data voltage to a corresponding data line. Consequently, the data driving unit supplies the data voltage Vdata to the data line DL for a data charging period of each horizontal period, and supplies the sensing data voltage to the data line DL for an initialization period of the sensing period (or an initialization period) and a voltage charging period. The data driving unit according to one embodiment may include a shift register for generating a sampling signal based on a data start signal and a data shift signal of a data control signal, a latch unit for latching the digital data per pixel based on the sampling signal, a gray scale voltage generating unit for generating a plurality of gray scale voltages by using the plurality of reference gamma voltages, a digital-to-analog converter for selecting and outputting a gray scale voltage corresponding to the latched data among the plurality of gray scale voltages, as a data voltage Vdata, and an output unit for outputting the data voltage Vdata to the data lines DL in accordance with a data output signal.

A slit SI is formed between the data driving integrated circuits IC1 and IC2. The slit SI is an opening area formed by partially removing the flexible circuit film CF. The slit SI serves to emit heat generated from the data driving integrated circuits IC1 and IC2 to the air.

The sensing unit is connected to the sensing line SL of each pixel P, and includes a switching portion and an analog-to-digital converter.

The switching portion selectively connects, to the sensing lines SL, a reference voltage supplying line for supplying a reference voltage Vref, a precharging voltage supplying line for supplying a precharging voltage Vpre, and an analog-to-digital converter. For example, the switching portion connects a reference voltage supplying line to the sensing lines SL for each horizontal period. On the other hand, for an initialization period of a sensing period, the switching portion connects a precharging voltage supplying line to the sensing lines SL. The switching portion floats the sensing lines SL for a data charging period of the sensing period, and connects the sensing lines SL to the analog-to-digital converter for a voltage sensing period of the sensing period.

When the analog-to-digital converter is connected to the sensing line SL by switching of the switching portion, it senses a voltage charged in the sensing lines SL, converts the sensed voltage into a digital form to generate sensing data, and outputs the generated sensing data to the outside.

The display apparatus according to one embodiment of the present disclosure further includes a control board 600 and a timing controller 700.

The control board 600 is connected to the printed circuit board 400 by signal cables 610 and 630. The control board 600 according to one embodiment is connected to a first printed circuit board 410 by a first signal cable 610, and is connected to a second printed circuit board 430 by a second signal cable 630. The control board 600 provides a signal supplied from an external host system to the timing controller 700, and transmits a signal output from the timing controller 700 to the printed circuit boards 410 and 430.

The timing controller 700 is packaged in the control board 600, and is supplied with a timing synchronization signal and image data from the external host system through a user connector.

The timing controller 700 according to one embodiment generates a gate control signal and a data control signal for controlling driving timings of the gate driving unit 200 and the plurality of data driving integrated circuits IC, respectively, based on a timing synchronization signal including a vertical synchronization signal, a horizontal synchronization signal, a data enable signal, a main clock signal, etc. The gate control signal may include at least one gate start signal, a plurality of gate shift clocks, a plurality of gate carry clocks, at least one reset clock, etc. The data control signal may include a source start signal, a source shift clock, a source output enable signal, etc.

The timing controller 700 according to one embodiment controls a driving timing of the gate driving unit 200 such that each pixel P connected to each gate line GL operates at a data charging period and a light emitting period, per one horizontal period. The timing controller 700 controls a driving timing of the plurality of data driving integrated circuits IC such that the data voltage Vdata is supplied to the data lines DL and the reference voltage Vref is supplied to the sensing lines SL for a data charging period. Also, the timing controller 700 controls a driving of the gate driving unit 200 such that each pixel P of a horizontal line selected for a sensing period operates at an initialization period, a voltage charging period, and a voltage sensing period, and controls a driving of each of the plurality of data driving integrated circuits IC such that a sensing data voltage is supplied to the data lines DL for an initialization period, or for an initialization period and a voltage charging period.

The timing controller 700 according to one embodiment generates a compensation value for compensating a characteristic change of the driving transistor Tdr of each pixel P based on sensing data corresponding to a threshold voltage and a mobility characteristic change of the driving transistor Tdr of each pixel P, wherein the sensing data are supplied from the sensing unit of the plurality of data driving integrated circuits IC. Then, the timing controller 700 reflects the compensation value in the digital data per pixel, thereby providing the compensation value to a corresponding data driving integrated circuit IC.

The display apparatus according to one embodiment of the present disclosure may further include a voltage generating unit 750 packaged in the control board 600.

The voltage generating unit 750 is packaged in the control board 600, and generates and outputs various voltages for displaying images on each pixel of the display panel 100 of the timing controller 700, the plurality of data driving integrated circuits IC and the gate driving unit 200, based on an input power source supplied through a user connector.

The data flexible circuit film CF of the present disclosure may be formed such that the leftmost data flexible circuit film and the rightmost data flexible circuit film arranged on the display panel 100 have a different configuration from the other data flexible circuit films. However, all data flexible circuit films CF attached onto one display panel may have the same size and the same number of pads. If a plurality of data flexible circuit films CF attached onto the same display panel have different sizes, processes may become complicated and the process time may be prolonged during the attachment process. Therefore, the present disclosure has a characteristic that one or more data flexible circuit films CF of different functions may be provided with the same size, for a simple attachment process to a display panel. Further, the data flexible circuit films can be repaired rapidly and easily.

Hereinafter, a difference and a similarity between the outermost data flexible circuit films and the other data flexible circuit films will be described with reference to FIGS. 4 and 5.

Figure 4:
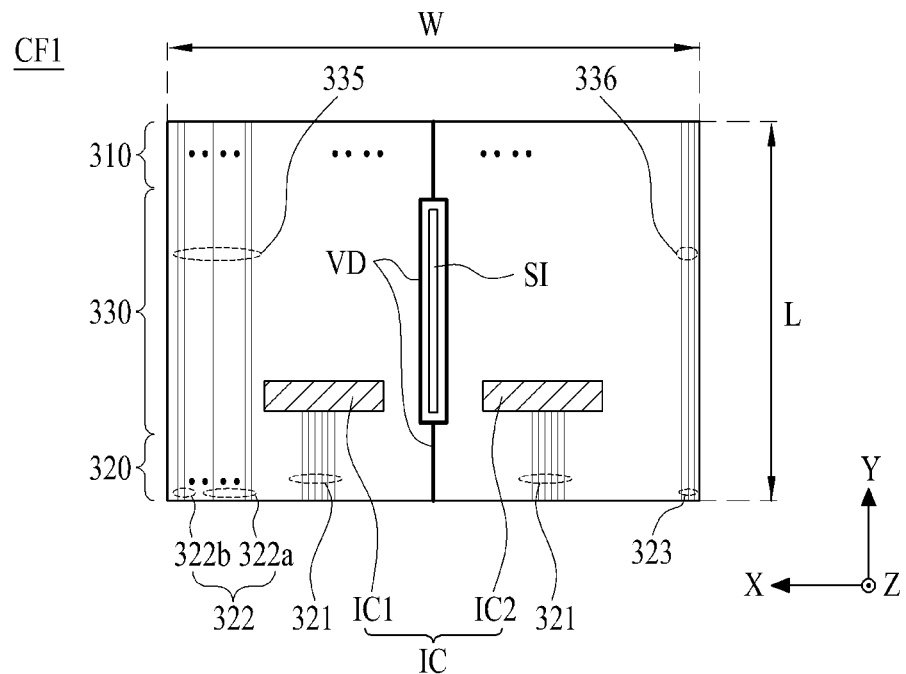
FIG. 4 is a view illustrating a first data flexible circuit film according to one embodiment of the present disclosure.

FIG. 4 is a view illustrating a first data flexible circuit film according to one embodiment of the present disclosure. The first data flexible circuit film CF1 means a flexible circuit film arranged at the leftmost side of the display panel 100. With reference to FIG. 4 together with FIGS. 1 and 3, the first data flexible circuit film CF1 according to one embodiment of the present disclosure may include a first input pad portion 310, a first output pad portion 320, a first middle portion 330, a slit SI, and a pixel driving voltage pad VD.

The first input pad portion 310 is attached onto the first printed circuit board 410 of the printed circuit board 400 with a predetermined width W. The first input pad portion 310 according to one embodiment may include a plurality of data input pads, a plurality of gate control signal input pads, at least one cathode voltage input pad, a plurality of reference gamma voltage input pads, etc. The plurality of data input pads and the plurality of reference gamma voltage input pads are connected to the data driving integrated circuits IC, respectively.

The first output pad portion 320 is attached onto the first pad portion PP1 of the display panel 100 with a predetermined width W. The first output pad portion 320 according to one embodiment may include a plurality of data output pads 321, a plurality of gate control signal output pads 322, and at least one cathode voltage output pad 323.

The plurality of data output pads 321 according to one embodiment may include 'i' data output pads, 'j' pixel driving voltage output pads, 'j' sensing line output pads, etc. The 'i' data output pads are connected to 'i' data pads of the first pad portion PP1 one to one, and the 'j' pixel driving voltage output pads are connected to 'j' pixel driving voltage pads of the first pad portion PP1 one to one. And the 'j' sensing line output pads are connected to 'j' sensing line pads of the first pad portion PP1 one to one.

The plurality of gate control signal output pads 322 according to one embodiment are connected to a plurality of gate pads of the first pad portion PP1 one to one. For example, the plurality of gate control signal output pads 322 may include a plurality of signal output pads 322a and a plurality of gate driving voltage output pads 322b.

At least one cathode voltage output pad 323 is connected to at least one cathode voltage pad provided in the first pad portion PP1.

The number of pads of the first output pad portion 320 may be increased in accordance with the numbers of 'i' data output pads, 'j' pixel driving voltage output pads, and 'j' sensing line output pads, which are increased in accordance with increase of resolution of the display panel, or in accordance with increase of the number of gate control signals supplied to the gate driving unit.

The first middle portion 330 is provided between the first input pad portion 310 and the first output pad portion 320.

The first middle portion 330 according to one embodiment includes a chip packaging area. The chip packaging area is an area in which the first data driving integrated circuit IC1 and the second data driving integrated circuit IC2 are packaged, and may include a plurality of input terminal portions connected to the first input pad portion 310 and connected to input bumps of the data driving integrated circuit IC, and a plurality of output terminal portions connected to data pads of the first output pad portion 320 and connected to output bumps of the data driving integrated circuit IC.

The first middle portion 330 according to one embodiment includes a plurality of gate control signal transmission line portions 335 and a plurality of cathode voltage transmission line portions 336.

The plurality of gate control signal transmission line portions 335 are provided at one side of the chip packaging area, and connect the plurality of gate control signal input pads of the first input pad portion 310 to the plurality of gate control signal output pads 322 of the first output pad portion 320 one to one. The gate control signal transmission line portions 335 according to one embodiment may include a plurality of gate control signal transmission lines.

The cathode voltage transmission line portions 336 are provided at the other side of the chip packaging area, and connect at least one cathode voltage input pad of the first input pad portion 310 to at least one cathode voltage output pad 323 of the first output pad portion 320 one to one. The cathode voltage transmission line portions 336 according to one embodiment may include at least one cathode voltage transmission line.

The slit SI is provided in the first middle portion 330. Particularly, the slit SI is provided between the first data driving integrated circuit IC1 and the second data driving integrated circuit IC2. The slit SI is an opening area formed by removing the flexible circuit film CF. Heat generated from the data driving integrated circuit IC may easily be emitted to the air through the slit SI. Therefore, heat generated from the first data driving integrated circuit IC1 and heat generated from the second data driving integrated circuit IC2 do not influence on each other.

The pixel driving voltage pad VD may be configured as an integral pad extended from the first input pad portion 310 to the first output pad portion 320 by passing through the first middle portion 330. Particularly, the pixel driving voltage pad VD may be arranged to surround the periphery of the slit SI arranged at a center portion of the first data flexible circuit film CF1. The pixel driving voltage pad VD has a signal having a higher voltage than a signal through the other pad. Thus, it is preferable that the pixel driving voltage pad VD has a structure of a low resistance. To this end, the pixel driving voltage pad VD may have a structure to emit heat more easily by having a greater width than the other pads and by being arranged near the slit SI.

Since the nth data flexible circuit film CFn according to one embodiment has a structure symmetric with the first data flexible circuit film CF1 shown in FIG. 4 based on a center portion of the display panel 100, so as to be attached onto the nth pad portion PPn, its detailed description will be omitted. The nth data flexible circuit film CFn is a flexible circuit film attached onto the rightmost side of the display panel 100.

Figure 5:
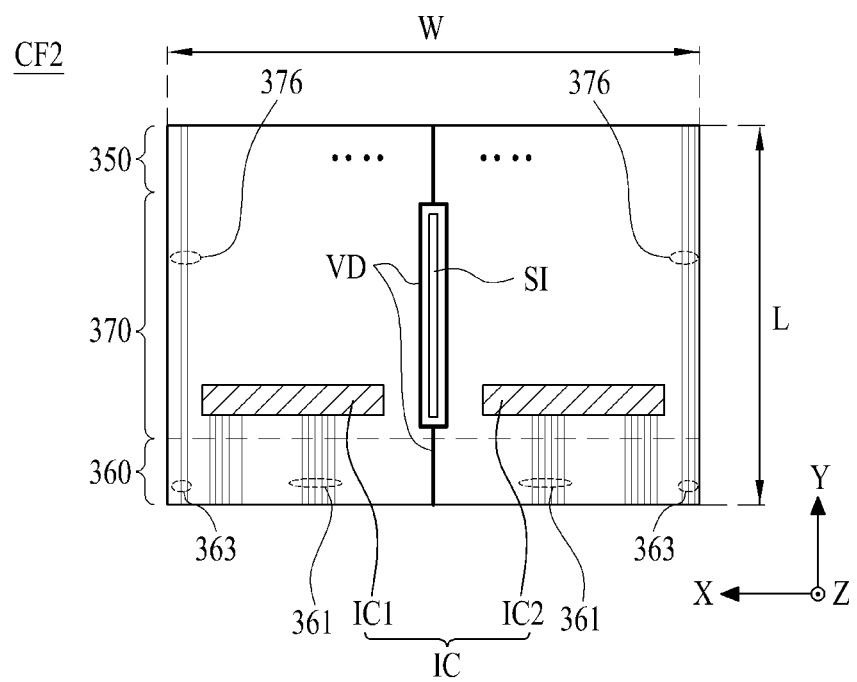
FIG. 5 is a view illustrating a second data flexible circuit film according to one embodiment of the present disclosure.

FIG. 5 is a view illustrating a second data flexible circuit film according to one embodiment of the present disclosure. The second data flexible circuit film CF2 means the other flexible circuit films except two outmost flexible circuit films on the display panel 100, i.e., the first data flexible circuit film CF1 and the nth data flexible circuit film CFn.

With reference to FIG. 5 together with FIGS. 1 and 3, the second data flexible circuit film CF2 according to one embodiment may include a second input pad portion 350, a second output pad portion 360, a second middle portion 370, a slit SI, and a pixel driving voltage pad VD.

The second input pad portion 350 is attached onto the first printed circuit board 410 of the printed circuit board 400 with a predetermined width W. The second input pad portion 350 according to one embodiment may include a plurality of data input pads, at least one cathode voltage input pad, a plurality of reference gamma voltage input pads, etc. The plurality of data input pads and the plurality of reference gamma voltage input pads are connected to the data driving integrated circuits IC, respectively. In this case, a width W of the second input pad portion 350 may be the same as the width W of the first input pad portion 310 of the first data flexible circuit film CF1 shown in FIG. 4.

The second output pad portion 360 has the same width as the width W, and is attached onto the second pad portion PP2 of the display panel 100.

The second output pad portion 360 according to one embodiment may include a plurality of data output pads 361, and at least one cathode voltage output pad 363.

The plurality of data output pads 361 according to one embodiment may include 'i' data output pads, 'j' pixel driving voltage output pads, 'j' sensing line output pads, etc. In this case, the 'i' data output pads are connected to 'i' data pads of the second pad portion PP2 one to one, and the 'j' pixel driving voltage output pads are connected to T pixel driving voltage pads of the second pad portion PP2 one to one. And, the 'j' sensing line output pads are connected to 'j' sensing line pads of the second pad portion PP2 one to one.

At least one cathode voltage output pad 363 is provided in the second output pad portion 360 in a state that the plurality of data output pads 361 are interposed therebetween. At least one cathode voltage output pad 363 is connected to at least one cathode voltage pad provided in the second pad portion PP2.

The number of pads of the second output pad portion 360 may be increased in accordance with increase of the numbers of 'i' data output pads, 'j' pixel driving voltage output pads, and 'j' sensing line output pads, which are increased in accordance with increase of resolution of the display panel.

The second middle portion 370 is provided between the second input pad portion 350 and the second output pad portion 360. The second middle portion 370 according to one embodiment includes a chip packaging area. The chip packaging area is an area in which the first data driving integrated circuit IC1 and the second data driving integrated circuit IC2 are packaged, and may include a plurality of input terminal portions connected to the second input pad portion 350 and connected to input bumps of the first and second data driving integrated circuits IC1 and IC2, and a plurality of output terminal portions connected to data pads of the second output pad portion 360 and connected to output bumps of the data driving integrated circuit IC.

The second middle portion 370 according to one embodiment includes cathode voltage transmission line portions 376.

The cathode voltage transmission line portions 376 are provided at both sides of the chip packaging area, and connect at least one cathode voltage input pad of the second input pad portion 350 to at least one cathode output pad 363 of the second output pad portion 370 one to one. The cathode voltage transmission line portions 376 according to one embodiment may include at least one cathode voltage transmission line.

The slit SI is provided in the second middle portion 370. Particularly, the slit SI is provided between the first data driving integrated circuit IC1 and the second data driving integrated circuit IC2. The slit SI is an opening area formed by removing the flexible circuit film CF. Heat generated from the data driving integrated circuit IC may easily be emitted to the air through the slit SI. Therefore, heat generated from the first data driving integrated circuit IC1 and heat generated from the second data driving integrated circuit IC2 do not influence on each other.

The pixel driving voltage pad VD may be configured as an integral pad extended from the second input pad portion 350 to the second output pad portion 360 by passing through the second middle portion 370. Particularly, the pixel driving voltage pad VD may be arranged to surround the periphery of the slit SI arranged at a center portion of the second data flexible circuit film CF2. The pixel driving voltage pad VD has a signal having a higher voltage than a signal through the other pad. Thus, it is preferable that the pixel driving voltage pad VD has a structure of a low resistance. To this end, the pixel driving voltage pad VD may have a structure to emit heat more easily by having a greater width than the other pads and by being arranged near the slit SI.

Since each of the third to (n−1)th data flexible circuit films CF3 to CFn−1 according to one embodiment of the present disclosure has the same structure as that of the second data flexible circuit film CF2, its detailed description will be omitted.

First Embodiment

Figure 6:
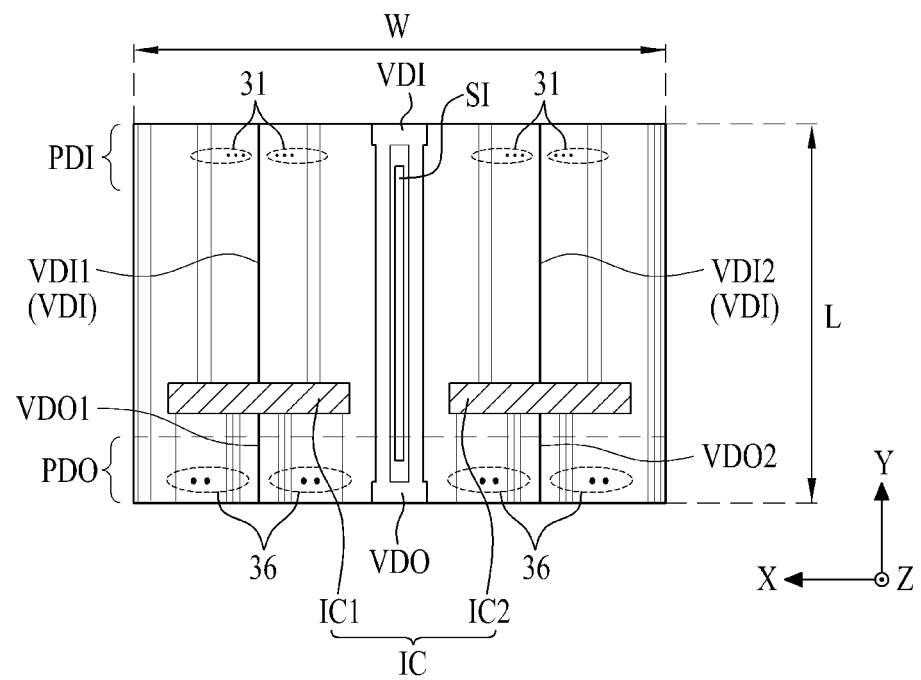
FIG. 6 is a plane view illustrating a structure of a flexible circuit film according to the first embodiment of the present disclosure.

The flexible circuit film CF attached onto the display panel 100 according to one embodiment of the present disclosure may have the same size and shape. However, detailed signals connected to pads of the input pad portion and the output pad portion may be configured differently. A structure of the aforementioned flexible circuit film according to the present disclosure will be described in various embodiments with reference to the drawings. FIG. 6 is a plane view illustrating a structure of a flexible circuit film according to the first embodiment of the present disclosure. Reference numerals not shown in FIG. 6 will be replaced by the same reference numerals shown in the previous drawings and aforementioned in the previous description.

The flexible circuit film CF according to the first embodiment of the present disclosure includes an input pad portion PDI, an output pad portion PDO, a first driving integrated circuit IC1, a second driving integrated circuit IC2, and a slit SI.

The input pad portion PDI is attached onto the printed circuit board 400 with a first width W. The output pad portion PDO is attached onto the display panel 100 with the same width as the first width W. However, the present disclosure is not limited to this. That is, the output pad portion PDO may have a width greater or smaller than the first width W.

The first driving integrated circuit IC1 and the second driving integrated circuit IC2 are spaced from each other by a predetermined interval between the input pad portion PDI and the output pad portion PDO. Each of the first driving integrated circuit IC1 and the second driving integrated circuit IC2 may have more than 960 channels, and may embody 1920 channels on one flexible circuit film CF.

The slit SI is arranged between the first driving integrated circuit IC1 and the second driving integrated circuit IC2, and passes through the flexible circuit film CF. If each of the first driving integrated circuit IC1 and the second driving integrated circuit IC2 has more than 960 channels, the flexible circuit film CF may be damaged due to heat emission. The slit SI formed by partially removing the flexible circuit film CF serves to emit heat generated from the first driving integrated circuit IC1 and the second driving integrated circuit IC2. For example, since heat generated from the first driving integrated circuit IC1 is emitted to the air through the slit SI, the heat does not influence on the second driving integrated circuit IC2. Further, heat generated from the second driving integrated circuit IC2 is also emitted to the air through the slit SI.

Particularly, the driving power pad VD for applying a driving power may be arranged near the slit SI. A driving power applied to the driving power pad VD may have a greater heat emission amount than that of the other pads due to its high voltage. Therefore, heat may be emitted more efficiently owing to the driving power pad VD.

The driving power pad VD may be spaced from the other pads far away. As shown in FIG. 6, the driving power pad VD may be formed with a great or maximum width at the input pad portion PDI and the output pad portion PDO of both ends of the slit SI. A middle portion for connecting the input pad portion PDI with the output pad portion PDO may be arranged along both sides of the slit SI.

If necessary, a first driving power pad VDI1 connected from the input pad portion PDI to the output pad portion PDO via the first driving integrated circuit IC1 may further be provided. Likewise, a second driving power pad VDI2 connected from the input pad portion PDI to the output pad portion PDO via the second driving integrated circuit IC2 may further be provided.

The driving power pad is separately arranged at a center portion, and is respectively arranged at the first driving integrated circuit IC1 and the second driving integrated circuit IC2. Therefore, a current density of the driving power pad may be distributed, heat emitted from the flexible circuit film CF may be distributed, and a heat emission effect may be maximized.

Figure 7:
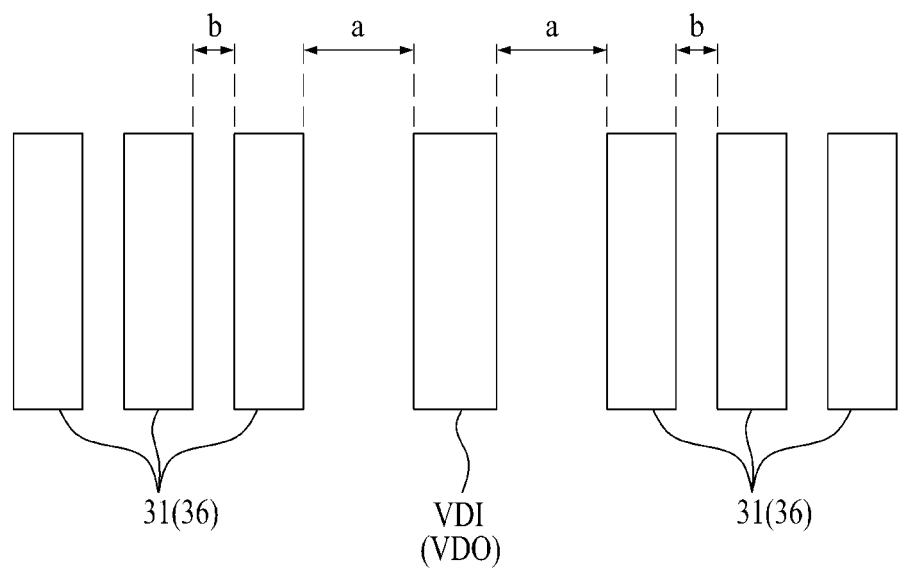
FIG. 7 is an enlarged plane view illustrating a spaced distance between pads arranged in a flexible circuit film according to the first embodiment of the present disclosure.

Description will be given in more detail. If necessary, an arrangement interval between pads will be described with further reference to FIG. 7. FIG. 7 is a plane enlarged view illustrating a spaced distance between pads arranged on a flexible circuit film according to the first embodiment of the present disclosure.

A plurality of data input pads 31 may be arranged on the input pad portion PDI with a first interval 'b'. The plurality of data input pads 31 may be connected to the first driving integrated circuit IC1 and the second driving integrated circuit IC2 in a uniformly-distributed manner. A first driving power input pad VDI1 connected to the first driving integrated circuit IC1 may be arranged, and a second driving power input pad VDI2 connected to the second driving integrated circuit IC2 may be arranged. The first and second driving power input pads VDI1 and VDI2 may be arranged to correspond to the center portions of the first and second driving integrated circuits IC1 and IC2, respectively, or may be arranged on at least one of both ends.

In this case, if the first driving power input pad VDI1 is arranged to adjoin the data input pads, a spaced distance between the data input pads 31 and the first driving power input pad VDI1 may be a second interval 'a' greater than the first interval 'b'.

A plurality of data output pads 36 may be arranged at the output pad portion PDO with a third interval. The third interval may be the same as the first interval 'b' (the interval between the data input pads 31), or may be different from the first interval in accordance with a design. The plurality of data output pads 36 may be connected to the first driving integrated circuit IC1 and the second driving integrated circuit IC2 in a uniformly-distributed manner. A first driving power output pad VDO1 connected to the first driving integrated circuit IC1 may be arranged, and a second driving power output pad VDO2 connected to the second driving integrated circuit IC2 may be arranged. The first and second driving power output pads VDO1 and VDO2 may be arranged to correspond to the center portions of the first and second driving integrated circuits IC1 and IC2, respectively, or may be arranged on at least one of both ends.

In this case, if the first driving power output pad VDO1 is arranged to adjoin the data output pads 36, a spaced distance between the data output pads 36 and the first driving power output pad VDO1 may be a second interval 'a' greater than the first interval 'b'.

Second Embodiment

Figure 8:
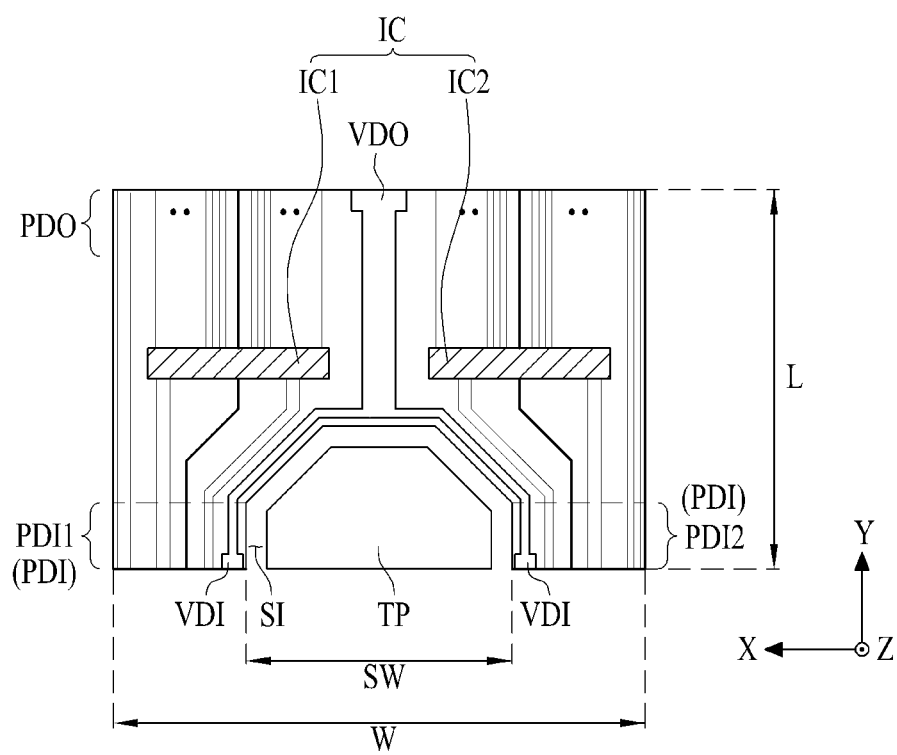
FIG. 8 is a plane view illustrating a structure of a flexible circuit film according to the second embodiment of the present disclosure.

Hereinafter, the second embodiment will be described with reference to FIG. 8. FIG. 8 is a plane view illustrating a structure of a flexible circuit film according to the second embodiment of the present disclosure.

Referring to FIG. 8, a basic structure of the flexible circuit film according to the second embodiment is the same as or similar to that of the first embodiment. Particularly, a connection between an input pad portion PDI and an output pad portion PDO is the same as that of the first embodiment, and thus its detailed description will be omitted. The second embodiment is different from the first embodiment in view of a slit structure. In the second embodiment, a slit is arranged in a flexible circuit film so as to divide the input pad portion PDI. For example, a slit width SW corresponding to at least '1/n' of an entire width W of the input pad portion may be formed between the input pad portions. In this case, 'n' may be a natural number equal to or less than 20.

For example, the input pad portion PDI is provided with a first input pad portion PDI1, a second input pad portion PDI2, and a slit SI. The first input pad portion PDI1 corresponds to the first driving integrated circuit IC1, and the second input pad portion PDI2 corresponds to the second driving integrated circuit IC2. The slit SI is formed between the first input pad portion PDI1 and the second input pad portion PDI2, and has a slit width SW greater than ½ of the width W of the flexible circuit film CF. A bonding means TP may be provided in the slit SI.

The bonding means TP may be a means for bonding an additional device to a rear surface of the display panel 100. For example, the bonding means TP may be a double-sided tape. As a double-sided tape is arranged in slits SI formed in a plurality of flexible circuit films CF, a plurality of double-sided tape pieces may be formed with a predetermined interval. A back cover (not shown) may be attached to the rear surface of the display panel 100 by using a double-sided tape. In this case, since a plurality of double-sided tape pieces are arranged with a predetermined interval, the back cover may be attached onto the rear surface without a gap.

Since the slit SI has a structure to divide the input pad portion PDI, the driving power input pad arranged near the slit SI has a structure corresponding to a shape of the slit SI. For example, two driving power input pads VDI may be arranged at the first and second input pad portions PDI1 and PDI2, respectively. On the other hand, one driving power output pad VDO may be arranged at the center portion of the output pad portion PDO.

In the second embodiment, the flexible circuit film may be bent to the rear surface of the display panel. The input pad portion PDI may be attached onto the printed circuit board. The output pad portion PDO may be attached onto the display panel. At the rear surface of the display panel, the bonding means TP may be disposed. As the flexible circuit film may be bent behind the display panel, the bending means TP may be located within the area of the slit SI.

The display apparatus of the present disclosure comprises a display panel and a flexible circuit film. The flexible circuit film may include flexible circuit films arranged on the outermost area of the display panel, and flexible circuit films arranged on the remaining area of the display panel. However, all of the flexible circuit films may have the same size and the same shape. Also, the same number of pads may be arranged in the flexible circuit films. However, a type of pads to be connected may be configured differently.

For example, the outermost flexible circuit film may include first data pads and first pads. On the other hand, the other flexible circuit films may include second data pads and second pads. In this case, the number of the first data pads may be the same as the number of the second data pads, and the number of the first pads may be the same as the number of the second pads. However, the first pads may transmit gate driving signals, whereas the second pads may supply a driving power to the display panel.

Therefore, it can be more economical and efficient than using a plurality of flexible circuit films of different sizes and standards. Also, in case of using unused dummy pads as a driving power pad having a high current density, the current density can be distributed to effectively control heat emission, and the driving efficiency can be enhanced.

In the present disclosure, even if the number of gate control signals supplied to the gate driving unit is increased, the gate control signals can be transmitted to the gate driving unit, by using the data flexible circuit film in which the data driving integrated circuit is packaged, without using a separate signal transmission film.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display apparatus, comprising:
    a display panel having a plurality of gate lines and a plurality of data lines;
    a plurality of flexible circuit films attached onto a first side of the display panel; and
    a printed circuit board attached onto each of the flexible circuit films,
    wherein the each of the flexible circuit film includes:
        an input pad portion having a first width and attached to the printed circuit board;
        an output pad portion having same width as the first width, attached to the display panel;
        a first driving integrated circuit and a second driving integrated circuit arranged between the input pad portion and the output pad portion and spaced apart from each other with a predetermined interval, on the each of the flexible circuit film; and
        a slit arranged between the first driving integrated circuit and the second driving integrated circuit, passing through the each of the flexible circuit film.

2. The display apparatus of claim 1, wherein the flexible circuit film further comprises a driving power pad arranged near the slit and extended from the input pad portion to the output pad portion to supply a driving power.

3. The display apparatus of claim 2, wherein the driving power pad comprises:
    a first driving power pad extended from the input pad portion to the first driving integrated circuit to supply the driving power; and
    a second driving power pad extended from the input pad portion to the second driving integrated circuit to supply the driving power.

4. The display apparatus of claim 2, wherein the driving power pad is arranged on both of a left side and a right side of the slit.

5. The display apparatus of claim 2, wherein the driving power pad is formed with a maximum width at the input pad portion and the output pad portion of both ends of the slit.

6. The display apparatus of claim 2, wherein the slit has a structure to divide the input pad portion, and the driving power pad arranged near the slit has a structure corresponding to a shape of the slit.

7. The display apparatus of claim 1, wherein the input pad portion includes:
    a plurality of data input pads corresponding to the plurality of data lines; and
    a driving power input pad supplied with a driving power,
    wherein the plurality of data input pads are spaced apart from each other with a first interval, and
    the driving power input pad is spaced apart from an adjacent data input pad with a second interval greater than the first interval.

8. The display apparatus of claim 1, wherein the output pad portion includes:
    a plurality of data output pads corresponding to the plurality of data lines; and
    a driving power output pad for outputting a driving power,
    wherein the plurality of data output pads are spaced apart from each other with a first interval, and
    the driving power output pad is spaced apart from an adjacent data output pad with a second interval greater than the first interval.

9. The display apparatus of claim 1, further comprising a gate driving unit arranged at one of a second side and a third side perpendicular to the first side of the display panel and connected to the plurality of gate lines,
    wherein an outermost flexible circuit film adjacent to the gate driving unit among the plurality of flexible circuit films further includes a gate driving pad for supplying gate driving signals to the gate driving unit.

10. The display apparatus of claim 9, wherein the outermost flexible circuit film includes first data pads and first pads,
    other flexible circuit films include second data pads and second pads,
    the number of the first data pads is same as the number of the second data pads,
    the number of the first pads is same as the number of the second pads,
    the first pads transfer the gate driving signals, and
    the second pads supply a driving power to the display panel.

11. The display apparatus of claim 1, wherein the input pad portion includes:
    a first input pad portion corresponding to the first driving integrated circuit; and
    a second input pad portion corresponding to the second driving integrated circuit,
    wherein the slit is provided between the first input pad portion and the second input pad portion and has a width greater than ½ of the first width, and
    the slit further includes a bonding means therein.

12. The display apparatus of claim 11, wherein the first input pad portion and the second input pad portion are spaced apart from each other by the slit, and each of them has a second width smaller than ½ of the first width, and
    the bonding means is arranged between the first input pad portion and the second input pad portion.

13. The display apparatus of claim 1, further comprising a plurality of pixel driving voltage lines formed in parallel to the plurality of data lines and a driving voltage common line commonly connected to the plurality of pixel driving voltage lines.

14. The display apparatus of claim 13, wherein the display panel is divided into a display portion and a non-display portion surrounding the display portion, the driving voltage common line is provided between an upper non-display portion of the non-display portion, which is adjacent to one ends of the plurality of data lines, and the display portion.

15. The display apparatus of claim 1, wherein the plurality of flexible circuit films have same size and same shape.

* * * * *